(12) United States Patent
Saito et al.

(10) Patent No.: US 8,832,603 B2
(45) Date of Patent: Sep. 9, 2014

(54) EMPHASIS-ADDING SYSTEM AND EMPHASIS-ADDING METHOD

(75) Inventors: Taketo Saito, Atsugi (JP); Tomoyuki Ikai, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 562 days.

(21) Appl. No.: 13/192,091

(22) Filed: Jul. 27, 2011

(65) Prior Publication Data

US 2012/0042287 A1 Feb. 16, 2012

(30) Foreign Application Priority Data

Aug. 11, 2010 (JP) ................................ 2010-180415

(51) Int. Cl.
*G06F 3/048* (2013.01)
*G01R 31/319* (2006.01)

(52) U.S. Cl.
CPC ................................ *G01R 31/31917* (2013.01)
USPC ............................ 715/856; 715/859; 715/857

(58) Field of Classification Search
CPC ............................ G06F 3/04812; G06F 3/038
See application file for complete search history.

(56) References Cited

U.S. PATENT DOCUMENTS

| | | | |
|---|---|---|---|
| 7,795,879 B2* | 9/2010 | Watanabe | 324/537 |
| 8,040,940 B2* | 10/2011 | Satou | 375/221 |
| 2005/0229053 A1* | 10/2005 | Sunter | 714/724 |
| 2006/0238477 A1* | 10/2006 | Lew et al. | 345/94 |
| 2008/0240212 A1* | 10/2008 | Satou | 375/221 |
| 2010/0063760 A1* | 3/2010 | Rule et al. | 702/68 |
| 2011/0242333 A1* | 10/2011 | Zhu et al. | 348/194 |

FOREIGN PATENT DOCUMENTS

| | | |
|---|---|---|
| JP | 8-293771 | 11/1996 |
| JP | 11-195053 | 7/1999 |
| JP | 2005-94172 | 4/2005 |
| JP | 2008-271552 | 11/2008 |
| WO | WO 2009/128114 A1 | 10/2009 |

OTHER PUBLICATIONS

Office Action issued in corresponding Japanese App. No. 2011-059458, mailed Oct. 1, 2013 (with translation).

* cited by examiner

*Primary Examiner* — Matt Kim
*Assistant Examiner* — Hua Lu
(74) *Attorney, Agent, or Firm* — Greer Burns & Crain Ltd.

(57) ABSTRACT

A display part is provided with a display screen with a horizontal axis representing a time and a vertical axis representing an amount of modulation and a pre-emphasis waveform image is displayed on the display screen. In the pre-emphasis waveform image, a cursor can be arranged on a tap which corresponds to a portion in which a bit can be emphasized. An emphasis waveform addition part generates an emphasis waveform corresponding to the pre-emphasis waveform image on the display screen, based on an amount of amplitude changed according to movement of the cursor, and adds the emphasis waveform to the test signal. Thus, a user is allowed to make a setting with intuitive operation.

8 Claims, 9 Drawing Sheets

| Selector | Polarity | Amplitude voltage (mV) | Control voltage (mV) |
|---|---|---|---|
| P1 | NEG | VEE1=150 | 500 |
| P2 | POS | VEE2=500 | 200 |
| P3 | NEG | VEE3=150 | 200 |
| P4 | NEG | VEE4=0 | 500 |

| Selector | Polarity | Amplitude voltage (mV) | Control voltage (mV) |
|---|---|---|---|
| P1 | NEG | VEE1=150 | 900 |
| P2 | POS | VEE2=700 | 200 |
| P3 | NEG | VEE3=350 | 200 |
| P4 | NEG | VEE4=0 | 500 |

EMPHASIS-ADDING SYSTEM AND EMPHASIS-ADDING METHOD

CROSS-REFERENCE TO RELATED APPLICATIONS

This application is based upon and claims the benefit of priority from prior Japanese Patent Application No. 2010-180415, filed Aug. 11, 2010, the entire contents of which are incorporated herein by reference.

BACKGROUND OF THE INVENTION

1. Field of the Invention

The present invention relates to an emphasis-adding system and an emphasis-adding method for giving emphasis to a test signal serving as an original signal.

In this emphasis-adding system and the emphasis-adding method, emphasis is given in order to overcome waveform distortion of a test signal that is input via a transmission path such as a coaxial cable to a device-under-test such as a circuit-mounted substrate attached with a connector having a fast bus.

2. Description of the Related Art

For example, when a circuit-mounted substrate attached with a connector having a fast bus, which is low-cost but operating at a high rate, is adopted as a device-under-test (DUT), and a digital signal is input to the device-under-test using an electric signal or an optical signal via a coaxial cable, a waveform quality of a digital signal is deteriorated by the characteristics of the device-under-test. Accordingly, based on the deterioration of the waveform quality, bit error rate and jitter increase, and an amplitude of a waveform is changed. This may cause an adverse effect such as changing the shape of the eye pattern.

Figure 9:
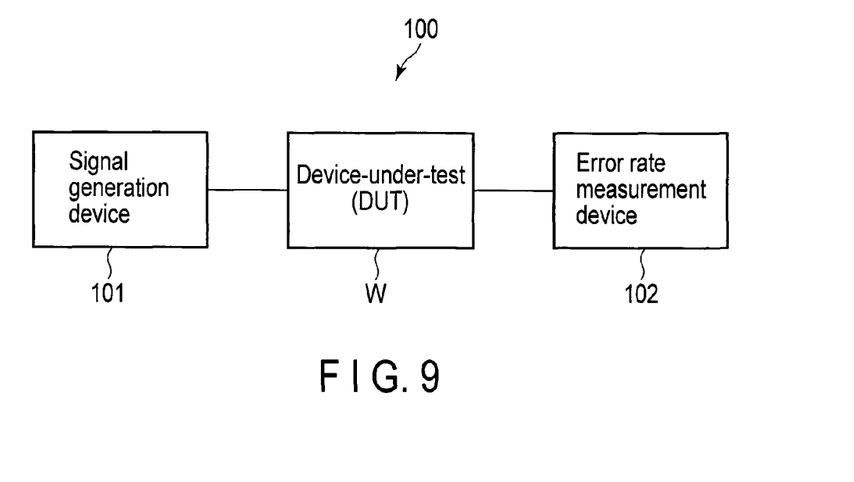
FIG. 9 is a schematic diagram illustrating a generally-available measurement system when deterioration of a waveform quality of a device-under-test is tested.

In this case, when this kind of deterioration of the waveform quality of the device-under-test is tested, a measurement system 100 as shown in FIG. 9 is generally used. In the measurement system 100 as shown in FIG. 9, a signal generation device 101 is connected to an input side of the device-under-test (DUT) W, and an error rate measurement device 102 is connected to an output side of the device-under-test W. In this measurement system 100, a test signal of a predetermined pattern is input from the signal generation device 101 to the device-under-test W, and an error rate measurement device 102 receives a signal that is output from the device-under-test W in accordance with the input of the test signal. Then, the error rate measurement device 102 compares the reception signal with the test signal that is input to the device-under-test W, measures the bit error rate, and measures the eye pattern, thus performing various kinds of tests of the device-under-test W.

However, when a non-pre-emphasized test signal is input, as it is, to the device-under-test W via the coaxial cable in the measurement system 100 as shown in FIG. 9, the signal is distorted as the frequency gets higher, and the signal is attenuated. This signal distortion deteriorates the bit error rate, and there is a problem in that the bit error rate cannot be correctly measured.

Accordingly, pre-emphasis given to the test signal serving as the original signal has been suggested as an effective solution for faithfully generating the test signal by compensating the attenuated portion of the signal in order to overcome the above distortion of the signal. For example, a technique disclosed in Jpn. Pat. Appln. KOKAI Publication No. 2008-271552 is known as a system and a method for generating this pre-emphasized signal.

In the system and the method disclosed in Jpn. Pat. Appln. KOKAI Publication No. 2008-271552, an input file including digital data representing a digital data pattern waveform is received, and the digital data are up-sampled with Fs/Fd rate. In this case, Fs denotes a sampling frequency, and Fd denotes a data rate. A step response is generated using the up-sampled digital data. The generated step response is differentiated, and a coefficient for pre-emphasis filter is generated. This coefficient and the digital data pattern waveform input signal are convoluted to generate a pre-emphasized digital data pattern. As a result, generation of various kinds of pre-emphasized signals is realized with the data generation system.

Figure 10:
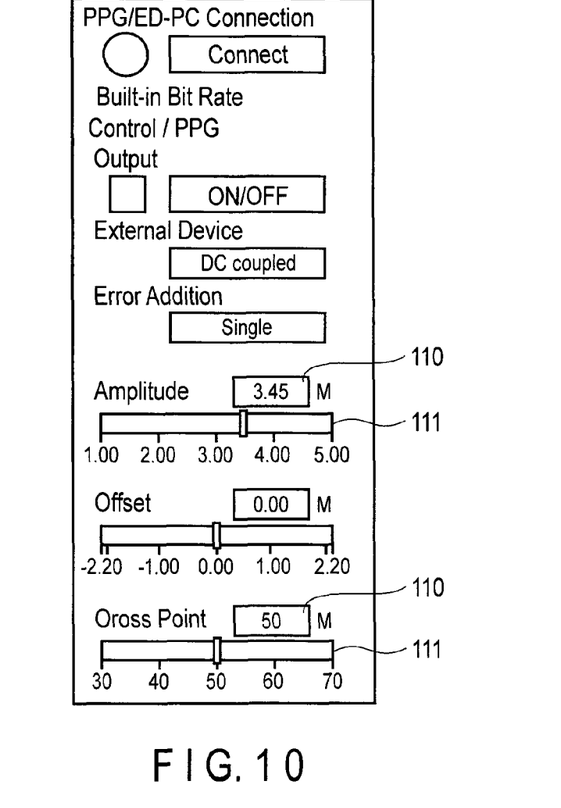
FIG. 10 is a schematic diagram illustrating a conventional example of display on a screen for setting a conventional parameter.

By the way, a pulse pattern generation system disclosed in, for example, Jpn. Pat. Appln. KOKAI Publication No. 2005-094172 is known as a system for generating a desired pulse pattern that is input to the device-under-test. As shown in FIG. 10, in the pulse pattern generation system disclosed in the publication, numerical values are increased/decreased by directly inputting values to text boxes 110, and an amplitude or cross point is set by moving scroll bars 111 within a predetermined setting range, so that a test signal having a desired pulse pattern is generated.

In this case, when a test signal input to the device-under-test is pre-emphasized, it is necessary to set parameters relating to the pre-emphasis in advance. When the setting method disclosed in Jpn. Pat. Appln. KOKAI Publication No. 2005-094172 is employed as the setting of the parameters relating to the pre-emphasis, it is necessary to set each parameter by increasing/decreasing numerical values directly input to the text boxes 110 or by moving the scroll bars 111 within the predetermined setting ranges as shown in FIG. 10. Therefore, there is a problem in that it is cumbersome for a user to set each parameter. In the setting method disclosed in Jpn. Pat. Appln. KOKAI Publication No. 2005-094172, there is a problem in that the user cannot imagine the generated pre-emphasis waveform and does not know which portion of the pre-emphasis waveform is manipulated. As a result, the user cannot intuitively set each parameter.

BRIEF SUMMARY OF THE INVENTION

An object of the present invention is to provide an emphasis-adding system and an emphasis-adding method allowing a user to make a setting with intuitive operation.

According to a first aspect of the invention, there is provided an emphasis-adding system for giving pre-emphasis to a digital test signal that is input to a device-under-test, the emphasis-adding system comprising:

a display part (5) that displays a pre-emphasis waveform image on a display screen with a horizontal axis representing a time and a vertical axis representing an amount of modulation, wherein a cursor (21) is arranged at a portion where an intensity of the pre-emphasis is changeable in the pre-emphasis waveform image;

a manipulating part (2) with which the cursor is moved; and an emphasis waveform addition part (8) that generates an emphasis waveform corresponding to the pre-emphasis waveform image on the display screen, based on an amount of amplitude changed according to movement of the cursor, and adds the emphasis waveform to the test signal.

According to a second aspect of the invention, there is provided the emphasis-adding system according to the first aspect of the invention, further comprising:

a position information detecting part (3) that detects position information about the cursor moved with the manipulating part;

an information storing part (4) that stores waveform information about a plurality of types of reference waveform patterns defined in advance, a changeable range of each cursor arranged at the tap of the reference waveform pattern, an amount of amplitude per dot on the display screen, and a time per dot on the display screen; and a setting value calculating part (7) that calculates a setting value for generating an emphasis waveform corresponding to the pre-emphasis waveform image on the display screen, based on the information stored in the information storing part and the position information of the cursor detected by the position information detecting part, wherein the emphasis waveform addition part generates an emphasis waveform corresponding to the pre-emphasis waveform image on the display screen, based on the setting value calculated by the setting value calculating part, and adds the emphasis waveform to the test signal.

According to a third aspects of the invention, there is provided the emphasis-adding system according to the first aspect of the invention, wherein the pre-emphasis waveform images corresponding to the test signals including two-channels made from the same waveform are displayed on the display screen of the display part (5), and a skew is set by relatively moving the pre-emphasis waveform images corresponding to the test signals including the two-channels in a time axis direction by manipulating the manipulating part (2).

According to a fourth aspect of the invention, there is provided the emphasis-adding system according to the second aspect of the invention, wherein the pre-emphasis waveform images corresponding to the test signals including two-channels made from the same waveform are displayed on the display screen of the display part (5), and a skew is set by relatively moving the pre-emphasis waveform images corresponding to the test signals including the two-channels in a time axis direction by manipulating the manipulating part (2).

According to a fifth aspect of the invention, there is provided an emphasis-adding method for giving pre-emphasis to a digital test signal that is input to a device-under-test, the emphasis-adding method comprising:

a pre-emphasis waveform image display step (S1) in which a pre-emphasis waveform image is displayed on a display screen with a horizontal axis representing a time and a vertical axis representing an amount of modulation, wherein a cursor is arranged at a portion where an intensity of the pre-emphasis is changeable in the pre-emphasis waveform image;

a cursor moving step (S2) with which the cursor is moved;

an emphasis waveform generating step (S5) in which an emphasis waveform corresponding to the pre-emphasis waveform image is generated based on an amount of amplitude changed according to movement of the cursor; and an emphasis waveform adding step (S6) in which the generated emphasis waveform is added to the test signal.

According to a sixth aspect of the invention, there is provided the emphasis-adding method according to the fifth aspect of the invention, further comprising:

an information storing step (S7) that stores waveform information about a plurality of types of reference waveform patterns defined in advance, a changeable range of each cursor arranged in the reference waveform pattern, the amount of amplitude per dot on the display screen, and a time per dot on the display screen;

a position information detection step (S3) in which position information of the moved cursor is detected; and a setting value calculating step (S4) in which a setting value for generating an emphasis waveform corresponding to the pre-emphasis waveform image is calculated based on the information stored in the information storing step and the position information of the cursor detected in position information detection step, wherein in the emphasis waveform generating step, an emphasis waveform corresponding to the pre-emphasis waveform image is generated based on the setting value calculated in the setting value calculating step.

According to a seventh aspect of the invention, there is provided the emphasis-adding method according to the fifth aspect of the invention, wherein in the pre-emphasis waveform image display step, the pre-emphasis waveform images corresponding to the test signals including two-channels made from the same waveform are displayed on the display screen, and a skew setting mode (S10) is further provided in which a skew is set by relatively moving the pre-emphasis waveform images corresponding to the test signals including the two-channels in a time axis direction.

According to a eighth aspect of the invention, there is provided the emphasis-adding method according to the sixth aspect of the invention, wherein in the pre-emphasis waveform image display step, the pre-emphasis waveform images corresponding to the test signals including two-channels made from the same waveform are displayed on the display screen, and a skew setting mode (S10) is further provided in which a skew is set by relatively moving the pre-emphasis waveform images corresponding to the test signals including the two-channels in a time axis direction.

According to a ninth aspect of the invention, there is provided the emphasis-adding method according to the fifth aspect of the invention, wherein in the pre-emphasis waveform image display step, the pre-emphasis waveform images corresponding to the test signals including two-channels made from the same waveform are displayed on the display screen, and a skew setting mode (S10) is further provided in which a skew is set by relatively moving the pre-emphasis waveform images corresponding to the test signals including the two-channels in a time axis direction.

According to a tenth aspect of the invention, there is provided the emphasis-adding method according to the sixth aspect of the invention, wherein in the pre-emphasis waveform image display step, the pre-emphasis waveform images corresponding to the test signals including two-channels made from the same waveform are displayed on the display screen, and a skew setting mode (S10) is further provided in which a skew is set by relatively moving the pre-emphasis waveform images corresponding to the test signals including the two-channels in a time axis direction.

BRIEF DESCRIPTION OF THE SEVERAL VIEWS OF THE DRAWING

FIG. 2C is a schematic diagram illustrating another example illustrating still another example of display corresponding to display of a portion of a pre-emphasis waveform image displayed in the display part of the system as shown in FIG. 1 in the waveform edit setting mode, and FIG. 2C shows not only a portion of positive bits but also a portion of negative bits;

DETAILED DESCRIPTION OF THE INVENTION

An emphasis-adding system according to an embodiment for carrying out the present invention will be hereinafter explained with reference to drawings in a specific manner.

Figure 1:
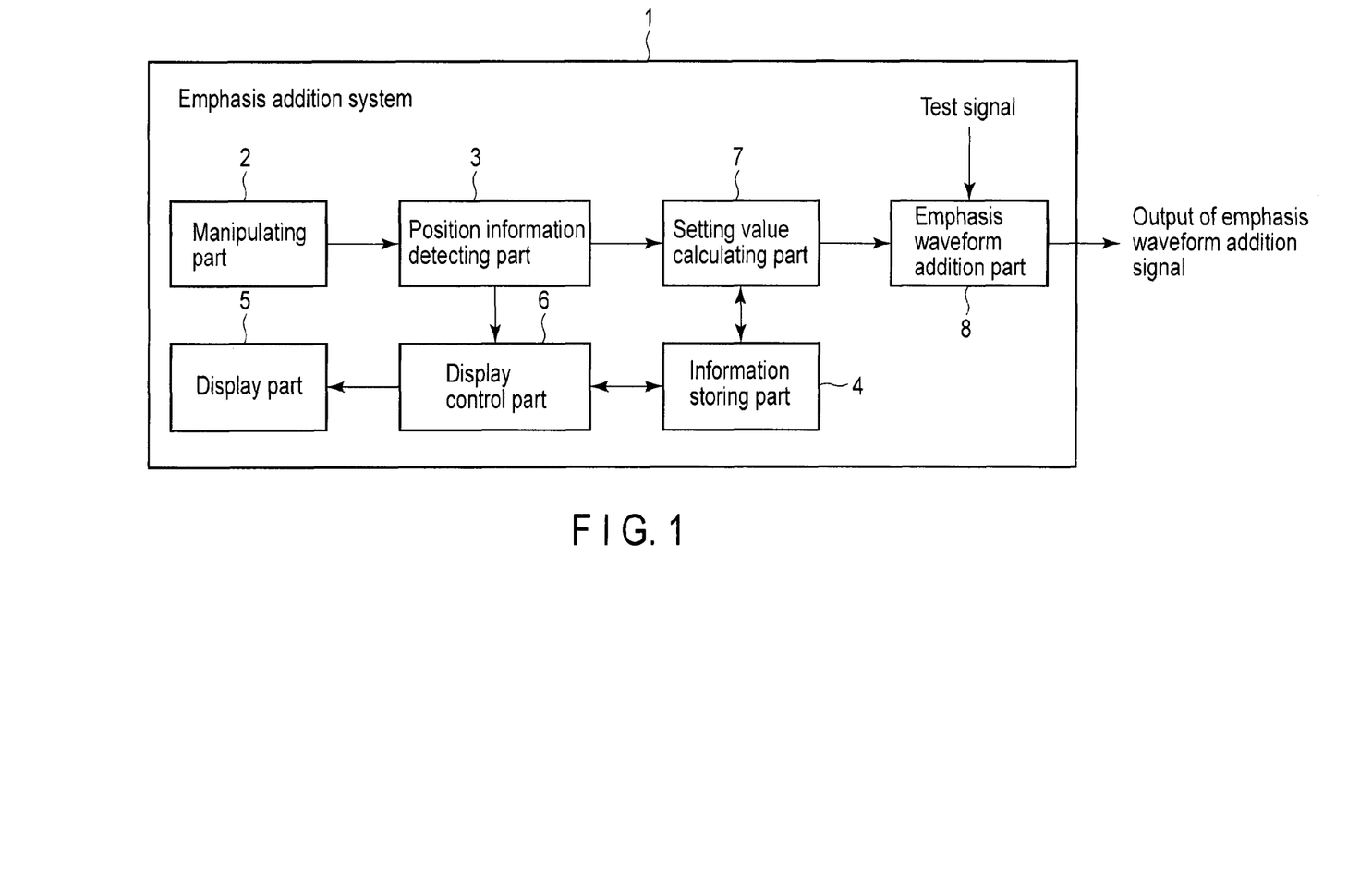
FIG. 1 is a block diagram schematically illustrating an emphasis-adding system according to an embodiment of the present invention.

As shown in FIG. 1, an emphasis-adding system 1 includes a manipulating part 2, a position information detecting part 3, an information storing part 4, a display part 5, a display control part 6, a setting value calculating part 7, and an emphasis waveform addition part 8. In this system, when an emphasis waveform is added to a test signal (original signal) of a predetermined pattern defined in advance, the manipulating part 2 and the display part 5 are adopted as a user interface, and the user operates the manipulating part 2 and uses the display on the display part 5 to intuitively can set parameters relating to the emphasis.

Figure 3:
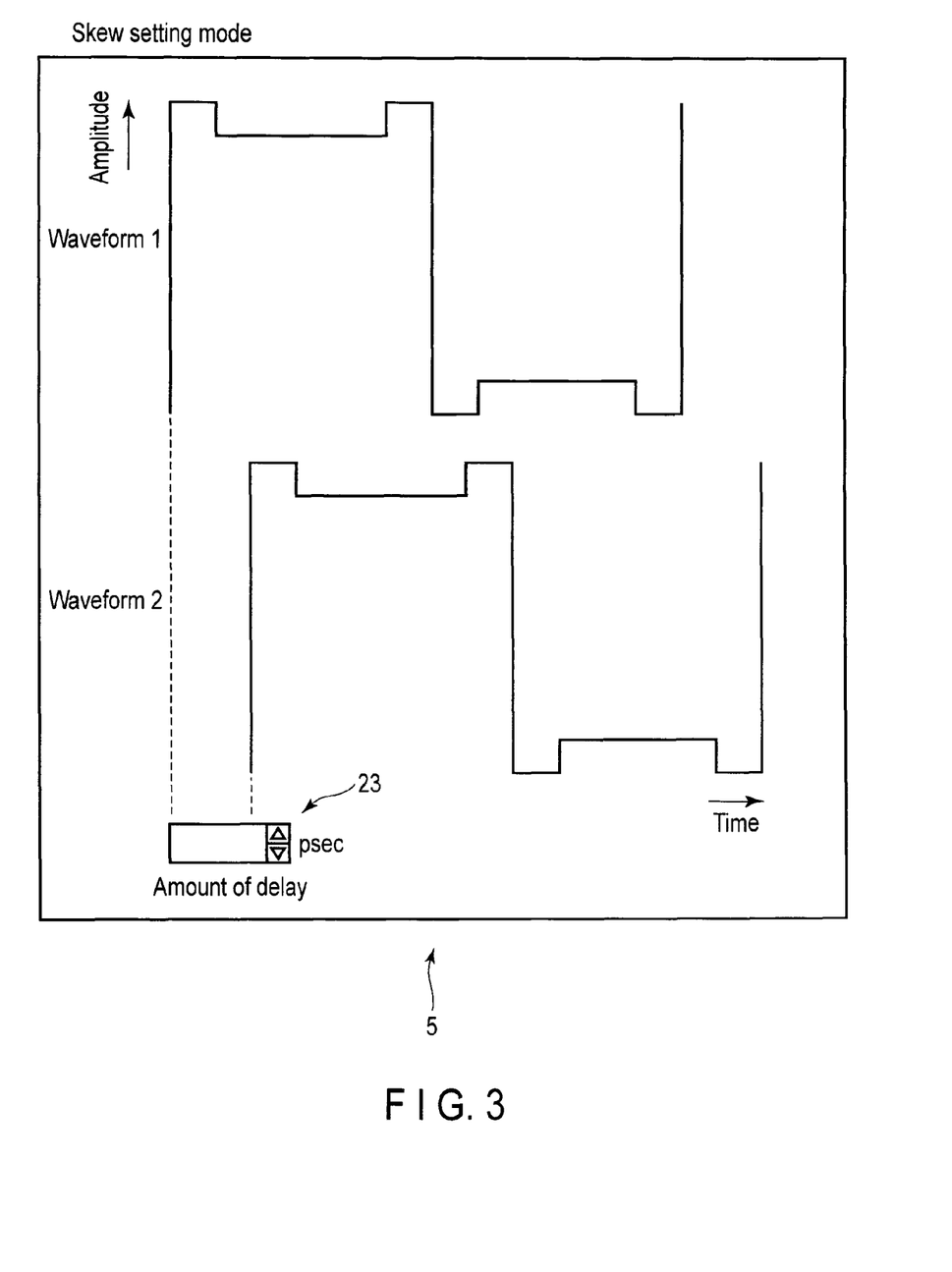
FIG. 3 is a schematic diagram illustrating an example of display on the display unit of the system as shown in FIG. 1 in a skew setting mode.
Figure 4:
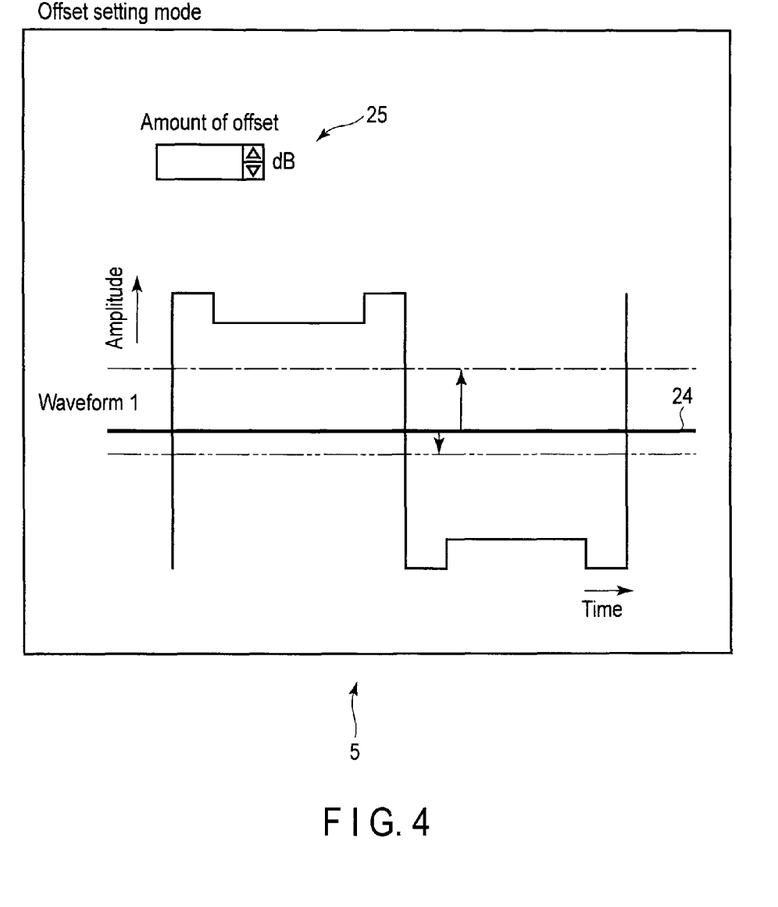
FIG. 4 is a schematic diagram illustrating an example of display on the display unit of the system as shown in FIG. 1 in an offset setting mode.

The manipulating part 2 for a user interface is constituted by, for example, a pointing device manipulated by a user such as a mouse. A user sees display of the display part 5, and uses the manipulating part 2 to set various kinds of parameters, instruction, or the like and execute various kinds of operations. As explained later in detail, the various kinds of operations and settings include a selection of various kinds of setting modes such as "waveform edit setting mode" as shown in FIG. 2, "skew setting mode" as shown in FIG. 3, and "offset setting mode" as shown in FIG. 4. The various kinds of operations and settings also include a switching of a setting screen in various kinds of setting modes and up/down movement of a cursor of each tap of a pre-emphasis waveform image displayed on the display screen of the display part 5 in the "waveform edit setting mode". The various kinds of operations and settings also include relative movement in a time axis direction of two-channel-pre-emphasis waveform images displayed on the display screen of the display part 5 in "skew setting mode", up/down movement of a offset line in "offset setting mode", input of a numerical value of a parameter to a numerical value input area of a text box in each setting mode, and the like.

In an image of a pre-emphasis waveform, a portion in which a bit can be emphasized by increasing/decreasing the amount of amplitude is called a tap. In the pre-emphasis waveform image, cursors that can be moved with the manipulating part 2 are arranged at taps at four portions within a repeating cycle of a waveform. However, the number of cursors is not limited to four. When the number of cursors is further increased, the amount of amplitude can be set more precisely.

The cursor on the display screen of the display part 5 changes to a pointer when the cursor moves on the display screen with the manipulating part 2. When this pointer reaches a cursor movable position of the pre-emphasis waveform image, the shape thereof may change to, for example, a shape of a double-headed arrow.

The position information detecting part 3 constantly detects position information about a cursor or pointer displayed on the display screen of the display part 5 manipulated with the mouse of the manipulating part 2, and successively outputs the position information obtained from this detection to the display control part 6.

The information storing part 4 stores various kinds of information needed for attaching an emphasis waveform to a test signal serving as an original signal. Examples of various kinds of information include waveform information about a plurality of types of reference waveform patterns (parameter values for identifying waveform shapes) defined in advance including pre-emphasis waveform of "1pre-1post-Coursor" defined in OIF 208.029.06, information about changeable range (upper and lower limit values) for each cursor arranged in a tap of a reference waveform pattern, an amount of amplitude per dot on the display screen of the display part 5, a time per dot, and the like.

The display part 5 is constituted by, for example, a liquid crystal display device, and displays various kinds of setting screens such as setting screens as shown in FIGS. 2 to 4 explained later in accordance with control of the display control part 6 based on operation of the manipulating part 2, in order to set a desired setting in a setting mode selected based on operation of the manipulating part 2.

The display control part 6 controls display of the display part 5 based on various kinds of information stored in the information storing part 4 or position information given by the position information detecting part 3 based on operation of the manipulating part 2. The display control part 6 displays the cursor dragged with the mouse of the manipulating part 2 in the "waveform edit setting mode" and the pre-emphasis waveform image dragged with the mouse of the manipulating part 2 in "skew setting mode" in colors different from each other defined in advance, so that they are distinguished from each other.

In the system configuration as shown in FIG. 1, the manipulating part 2, display part 5, and display control part 6 are divided into functions and are shown as different blocks.

However, the manipulating part 2, the display part 5, and the display control part 6 can be made with GUIs (graphical user interface) having a function capable of various kinds of operations/settings with intuitive operating using a pointing device such as a mouse and computer graphics.

In this case, the contents of display of the setting screens in various kinds of setting modes displayed in the display part 5 based on operation with the manipulating part 2 will be explained with reference to FIGS. 2A to 2C, FIGS. 3 and 4.

Figure 2A:
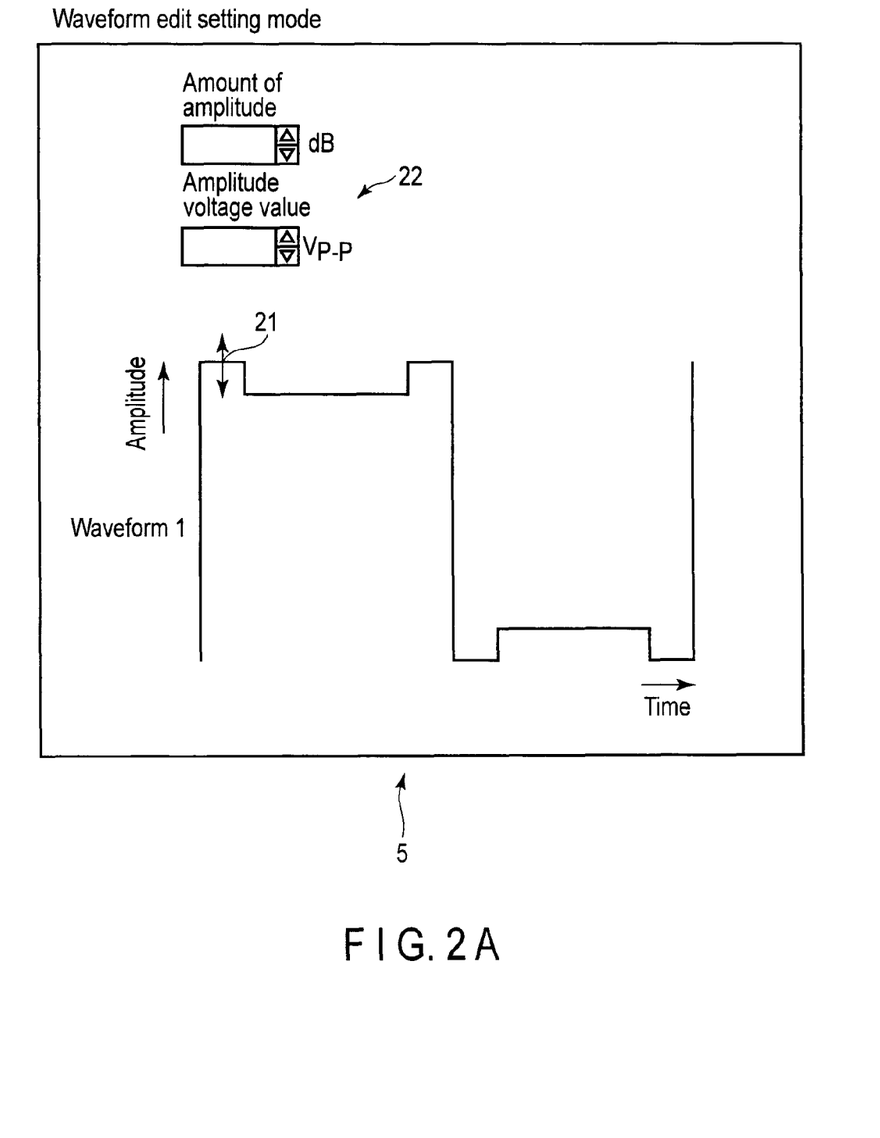
FIG. 2A is a schematic diagram illustrating an example of display of a portion of a pre-emphasis waveform image displayed in a display part of the system as shown in FIG. 1 in a waveform edit setting mode.
Figure 2B:
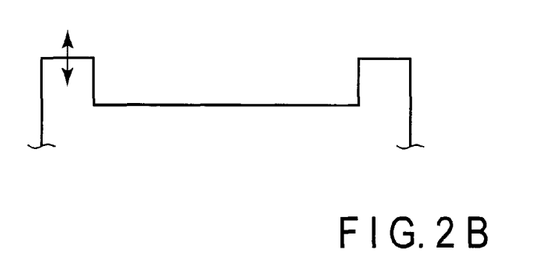
FIG. 2B is a schematic diagram illustrating another example corresponding to a display of a portion of a pre-emphasis waveform image displayed in the display part of the system as shown in FIG. 1 in the waveform edit setting mode.
Figure 2C:
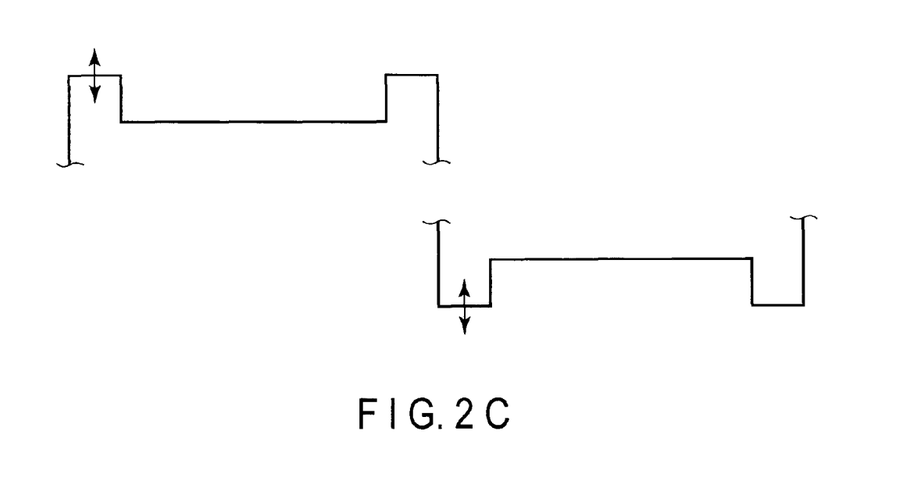

FIGS. 2A to 2C show setting screens, in a case where "waveform edit setting mode" for editing/setting the pre-emphasis waveform image is selected with the manipulating part 2. The setting screen displays any one of a pre-emphasis waveform image set as a default setting, a pre-emphasis waveform image selected from a plurality of pre-emphasis waveform images using the manipulating part 2 in "waveform edit setting mode", and a pre-emphasis waveform image set in the previous setting, and in the setting screen, the horizontal axis represents a time, and the vertical axis represents the amount of modulation. In a pre-emphasis waveform image on a display screen, a cursor 21 is arranged at a tap at a predetermined portion defined in advance within a repeating cycle of a waveform. When any one of the cursors 21 is dragged and the mouse of the manipulating part 2 and moved vertically, the amount of amplitude of the tap of the cursor 21 can be changed within a changeable range defined in advance.

It should be noted that the amount of modulation corresponds to the amount of amplitude (the amount of variation) that is increased/decreased in accordance with the amount of pre-emphasis applied to the amplitude voltage value of the reference waveform.

In the display screen as shown in FIG. 2A, a text box 22 having a numerical value input area for the amount of amplitude and the amplitude voltage value which change together with the movement of the cursor 21 is displayed in proximity to the pre-emphasis waveform image. This text box is displayed to correspond to the cursor 21 selected with the mouse of the manipulating part 2, and when the manipulating part 2 is manipulated, the numerical value of the amount of amplitude and the numerical value of the amplitude voltage value in the numerical value input area can be respectively increased/decreased and changed within changeable ranges defined in advance.

It should be noted that the entire waveform of the pre-emphasis waveform image may be displayed as shown in FIG. 2A, or a portion of the pre-emphasis waveform image may be displayed as shown in FIG. 2B. Alternatively, not only a portion of a positive bit but also a portion of a negative bit may be displayed as shown in FIG. 2C.

FIG. 3 shows a setting screen when "skew setting mode" is selected with the manipulating part 2. In "skew setting mode", a two-channel-pre-emphasis waveform images made from the same waveform are displayed, and skew setting can be made. In this setting screen, the horizontal axis represents a time, and a vertical axis represents the amount of modulation. In this setting screen, a two-channel-pre-emphasis waveform images made from the same waveform are displayed side by side in the vertical direction. In the setting screen of the "skew setting mode", the phase between the two pre-emphasis waveform images can be changed by dragging a rising edge of one of the pre-emphasis waveform images using the mouse of the manipulating part 2 and moving and dropping the rising edge to a desired position within a movable range in the time axis direction.

In the display screen as shown in FIG. 3, a text box 23 having a numerical value input area for the amount of delay which changes together with the movement of the both waveform images in the time axis direction is displayed in proximity to the two-channel-pre-emphasis waveform images. In the text box 23, the numerical value of the amount of delay in the numerical value input area can be increased or decreased and changed within a changeable range defined in advance by manipulating the manipulating part 2.

FIG. 4 illustrates a setting screen when "offset setting mode" for setting an offset is selected with the manipulating part 2. In this setting screen, the horizontal axis represents a time, and a vertical axis represents the amount of modulation. In this setting screen, a pre-emphasis waveform image is displayed, and in addition, an offset line 24 is displayed in parallel with the time axis. In the setting screen in this "offset setting mode", an offset value can be changed by dragging the offset line 24 using the mouse of the manipulating part 2 and moving and dropping the offset line 24 to a desired position within a movable range in the vertical direction as shown by an alternate long and short dashed line and a chain double-dashed line in FIG. 4.

In the display screen as shown in FIG. 4, a text box 25 having a numerical value input area for the amount of offset which changes together with the movement of the offset line 24 is displayed in proximity to the pre-emphasis waveform image. In the text box 25, the numerical value of the amount of offset in the numerical value input area can be increased or decreased and changed within a changeable range defined in advance by manipulating the manipulating part 2.

The setting value calculating part 7 calculates the amount of amplitude (the amount of variation) increased/decreased with respect to the amplitude voltage value based on various kinds of information stored in the information storing part 4 and the position information provided by the position information detecting part 3 obtained when the cursor 21 is moved by dragging the cursor 21 with the mouse of the manipulating part 2 and moving and dropping the cursor 21 in the vertical direction in "waveform edit setting mode". Then, the calculated amount of amplitude (the amount of variation) is divided into four amplitude voltages (VEE1, VEE2, VEE3, VEE4) corresponding to respective selectors P1, P2, P3, P4 of a switch circuit 13 explained later, and the dour divided amplitude voltages (VEE1, VEE2, VEE3, VEE4) are output as setting values, so that the same emphasis waveform as the pre-emphasis waveform image displayed on the display screen is added to the test signal by the emphasis waveform addition part 8.

The setting value calculating part 7 calculates the amount of delay, as a setting value, representing a phase difference between the two-channel-pre-emphasis waveform images from various kinds of information provided by the information storing part 4 and the position information provided by the position information detecting part 3 that is obtained by dragging the rising edge of one of the pre-emphasis waveform images using the mouse of the manipulating part 2 and moving and dropping the rising edge in the time axis direction in "skew setting mode".

Further, in "offset setting mode", the setting value calculating part 7 calculates the amount of offset, as a setting value, from various kinds of information provided by the information storing part 4 and the position information provided by the position information detecting part 3 obtained when the offset line 24 is dragged and moved and dropped in the vertical direction using the mouse of the manipulating part 2.

It should be noted that the setting value calculating part 7 constantly calculates the setting value from various kinds of information provided by the information storing part 4 and the position information provided by the position information detecting part 3 in synchronization with manipulation of the manipulating part 2 while a user drags an edge and a tap (cursor 21) of the pre-emphasis waveform image using the mouse of the manipulating part 2, and the setting value calculating part 7 determines the setting value when the mouse of the manipulating part 2 is dropped. The setting value constantly calculated by the setting value calculating part 7 is updated and displayed in, e.g., the numerical value input area of the text box as shown in FIGS. 2 to 4 on the display screen of the display part 5 in accordance with control of the display control part 6.

The emphasis waveform addition part 8 adds the same emphasis waveform as the pre-emphasis waveform image set in "waveform edit setting mode" to the test signal of the predetermined pattern (original signal that is not yet emphasized) that is input to the device-under-test, and outputs the test signal thereto.

Figures 5, 6:
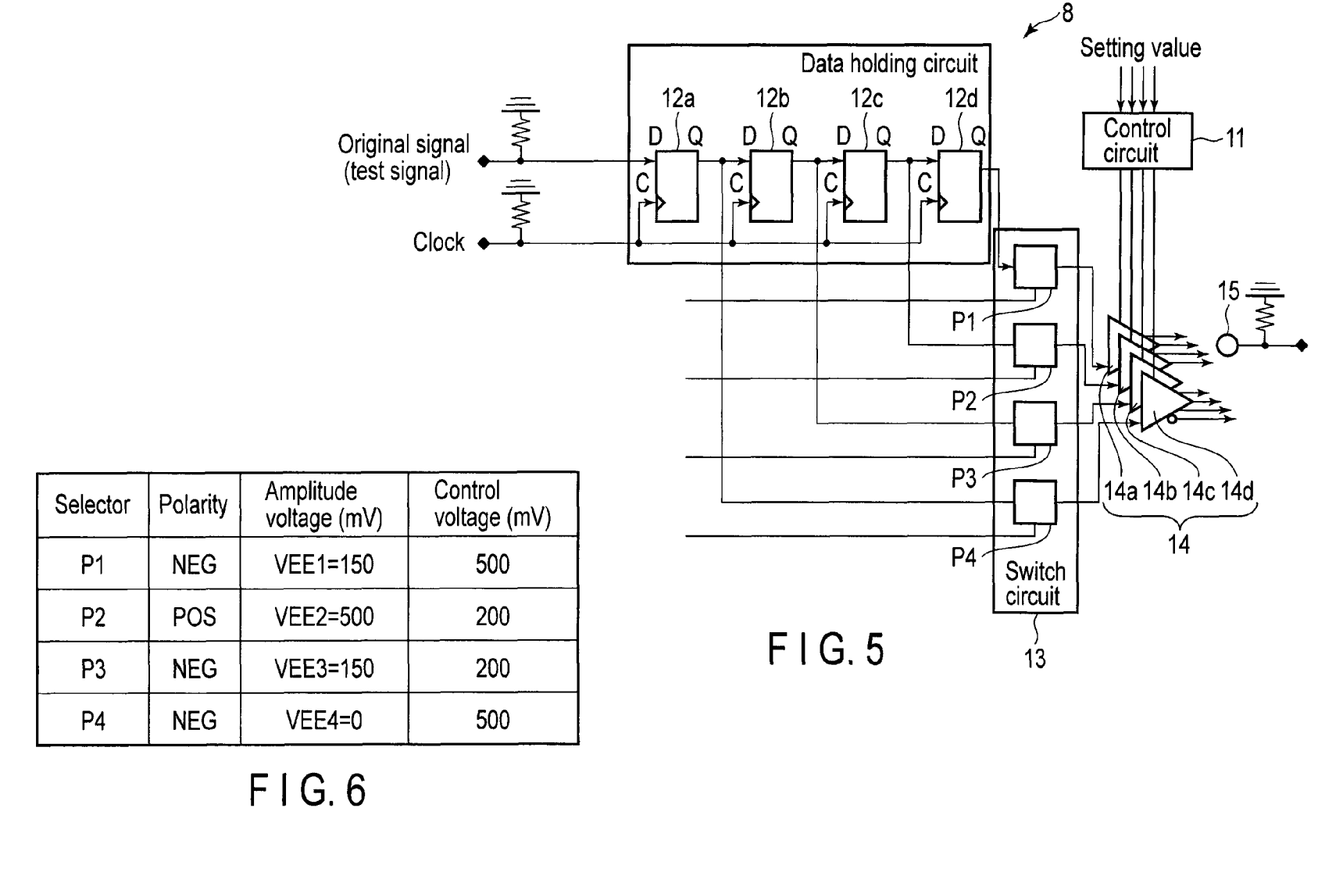
FIG. 5 is a circuit diagram illustrating an example of specific circuit configuration of an emphasis waveform addition part in the emphasis-adding system as shown in FIG. 1.
FIG. 6 is a table illustrating relationship between a polarity of each selector, an amplitude voltage distributed according to each selector, and a control voltage of an amplifier corresponding to the amplitude voltage in a circuit configuration as shown in FIG. 5.

This will be further explained. The emphasis waveform addition part 8 can be constituted by a known circuit including, for example, a control circuit 11, a data holding circuit 12, a switch circuit 13, an amplification circuit 14, and an adding circuit 15 as shown in FIG. 5.

The control circuit 11 is a circuit including a D/A converter. As shown in a table showing control conditions in FIG. 6, the control circuit 11 converts the setting values (amplitude voltages: VEE1, VEE2, VEE3, VEE4) provided by the setting value calculating part 7 into control signals (four control voltages) made of analog values for respectively controlling amplifiers 14a, 14b, 14c, 14d, explained later, of the amplification circuit 14, and outputs the control signals. In the control condition of FIG. 6, for example, conversion is performed as follows. A control voltage corresponding to an amplitude voltage VEE1=150 mV is 500 mV, a control voltage corresponding to an amplitude voltage VEE2=500 mV is 200 mV, a control voltage corresponding to an amplitude voltage VEE3=150 mV is 200 mV, and a control voltage corresponding to an amplitude voltage VEE4=0 mV is 500 mV.

The data holding circuit 12 is made by connecting four D-type flip-flop circuits (hereinafter abbreviated as D-FF) 12a, 12b, 12c, 12d in series, each of which holds, as a Q output, an input value of a D terminal at a rising edge of a C (clock) terminal. In the data holding circuit 12, the original signal (test signal) that is not added with the emphasis waveform is input to the D terminal of the D-FF 12a of the first stage, and is branched into four data signals each has a phase displacement of 1 bit, and the four data signals are output from the Q terminals of the respective D-FFs 12a, 12b, 12c, 12d.

The switch circuit 13 is constituted by four selectors P1, P2, P3, P4 connected, one by one, to the Q terminals of the four D-FFs 12a, 12b, 12c, 12d of the data holding circuit 12. The polarities of the respective selectors P1, P2, P3, P4 of the switch circuit 13 are set in advance to either "POS (positive)" state or "NEG (negative)" state in accordance with inputs of the switch signals. The control condition of FIG. 6 shows an example where the polarity of the selector P2 is set to "POS" and the polarities of the other selectors P1, P3, P4 are set to "NEG".

The amplification circuit 14 is constituted by the four amplifiers 14a, 14b, 14c, 14d connected, one by one, to the outputs of the four selectors P1, P2, P3, P4 of the switch circuit 13. The voltages of these four amplifiers 14a, 14b, 14c, 14d are respectively controlled based on the control signals (four control voltages) provided by the control circuit 11.

The adding circuit 15 adds the outputs of the four amplifiers 14a, 14b, 14c, 14d of the amplification circuit 14, and outputs a signal obtained by adding the emphasis waveform to the test signal serving as the original signal.

In this case, operation before and after the setting change of the emphasis waveform addition part 8 will be explained with reference to FIGS. 7A to 7C.

When "waveform edit setting mode" is selected with operation of the manipulating part 2, the currently set pre-emphasis waveform image (FIG. 7A) is displayed on the display screen of the display screen of the display part 5. In this state, the emphasis waveform addition part 8 controls the voltages of the amplifiers 14a, 14b, 14c, 14d of the amplification circuit 14 based on the control condition as shown in FIG. 6.

More specifically, the setting conditions of FIG. 6 are defined as follows. The amplitude voltage VEE1 corresponding to the selector P1 is defined as 150 mV. The amplitude voltage VEE2 corresponding to the selector P2 is defined as 500 mV. The amplitude voltage VEE3 corresponding to the selector P3 is defined as 150 mV. The amplitude voltage VEE4 corresponding to the selector P4 is defined as 0 mV.

In this state, according to the setting conditions of FIG. 6, the amplification circuit 14 of the emphasis waveform addition part 8 of FIG. 5 applies a control voltage 500 mV corresponding to the amplitude voltage VEE1=150 mV to the amplifier 14a, a control voltage 200 mV corresponding to the amplitude voltage VEE2=500 mV to the amplifier 14b, a control voltage 200 mV corresponding to the amplitude voltage VEE3=150 mV to the amplifier 14c, and a control voltage 500 mV corresponding to the amplitude voltage VEE4=0 mV to the amplifier 14d.

Figure 7A:
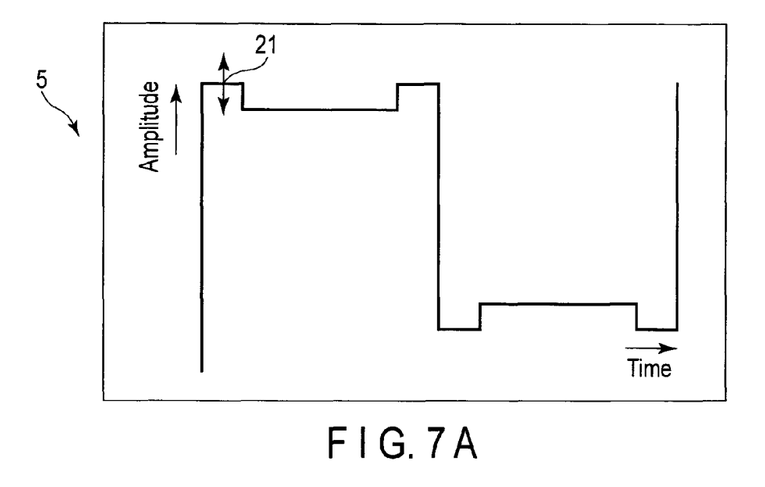
FIG. 7A is a schematic diagram illustrating a specific example of display on the display part of the emphasis-adding system as shown in FIG. 1 before change of setting.

Then, before the setting change, the emphasis waveform addition part 8 adds the same emphasis waveform as the pre-emphasis waveform image of FIG. 7A to the test signal, and outputs the test signal.

Figure 7B:
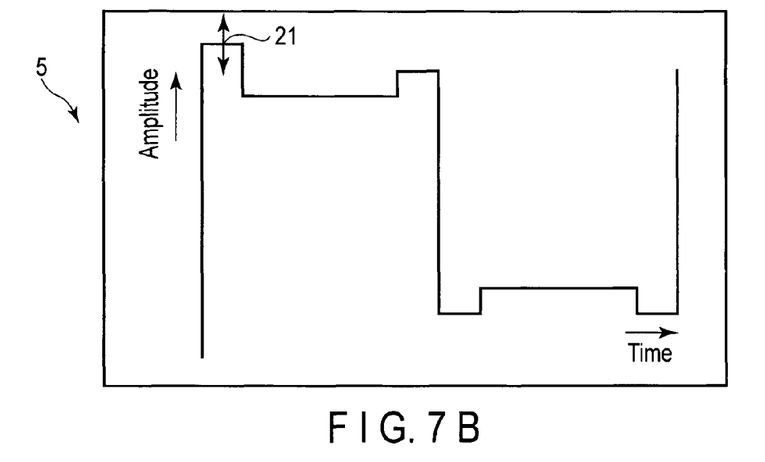
FIG. 7B is a schematic diagram illustrating a specific example of display on the display part of the emphasis-adding system as shown in FIG. 1 after change of setting.

Now, it is assumed that, in "waveform edit setting mode", the cursor 21 arranged at the tap at the left side of the pre-emphasis waveform image of FIG. 7A is dragged and dropped with the mouse of the manipulating part 2, so that the pre-emphasis waveform image changes from the state of FIG. 7A to the state of FIG. 7B. As a result of this change of state, the emphasis waveform addition part 8 controls the voltages of the amplifiers 14a, 14b, 14c, 14d of the amplification circuit 14 based on the control conditions as shown in FIG. 7C.

Figure 7C:
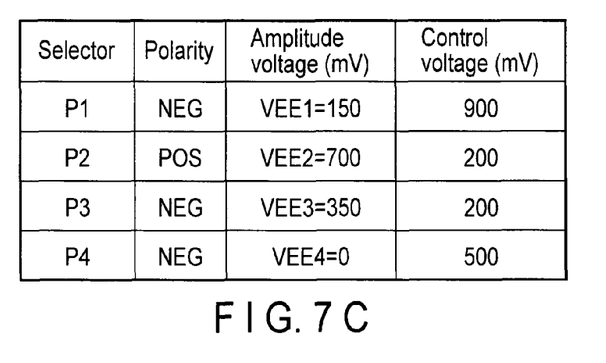
FIG. 7C is a table illustrating relationship between a polarity of each selector, an amplitude voltage distributed according to each selector, and a control voltage of an amplifier corresponding to the amplitude voltage in the circuit configuration as shown in FIG. 5 after the setting is changed as shown in the specific example displayed in FIG. 7B.

More specifically, in the control conditions of FIG. 7C, the amplitude voltage VEE1 corresponding to the selector P1 is 150 mV, the amplitude voltage VEE2 corresponding to the selector P2 is 700 mV, the amplitude voltage VEE3 corresponding to the selector P3 is 350 mV, and the amplitude voltage VEE4 corresponding to the selector P4 is 0 mV.

Then, according to the setting conditions of FIG. 7C, the amplification circuit 14 of the emphasis waveform addition part 8 of FIG. 5 applies a control voltage 900 mV corresponding to the amplitude voltage VEE1=150 mV to the amplifier 14a, a control voltage 200 mV corresponding to the amplitude voltage VEE2=700 mV to the amplifier 14b, a control voltage 200 mV corresponding to the amplitude voltage VEE3=350 mV to the amplifier 14c, and a control voltage 500 mV corresponding to the amplitude voltage VEE4=0 mV to the amplifier 14d.

Thus, after the setting change, the emphasis waveform addition part 8 adds the same emphasis waveform as the pre-emphasis waveform image as shown in FIG. 7B to the test signal, and outputs the test signal.

It should be noted that the emphasis waveform addition part 8 is not limited to the circuit configuration of FIG. 5 as long as the same emphasis waveform as the pre-emphasis waveform image set in "waveform edit setting mode" can be added to the test signal based on the position information provided by the position information detecting part 3, various kinds of information provided by the information storing part 4, and the setting values calculated by the setting value calculating part 7.

As described above, according to the emphasis-adding system and method of this embodiment, the pre-emphasis waveform image is displayed on the display screen of the display part 5 with the horizontal axis representing a time and a vertical axis representing the amount of modulation, and the cursor corresponding to each emphasized bit of the waveform is moved by drag and drop operation using the mouse of the manipulating part 2, so that the amplitudes can be change in units of emphasized bits. Therefore, this can save the user from operation required for settings when the emphasis waveform is added to the test signal serving as the original signal. Moreover, the user can not only recognize the generated emphasis waveform on setting screen, but also understand which portion of the emphasis waveform is manipulated on display screen, so that the user can intuitively set each parameter relating to the emphasis.

Figure 8:
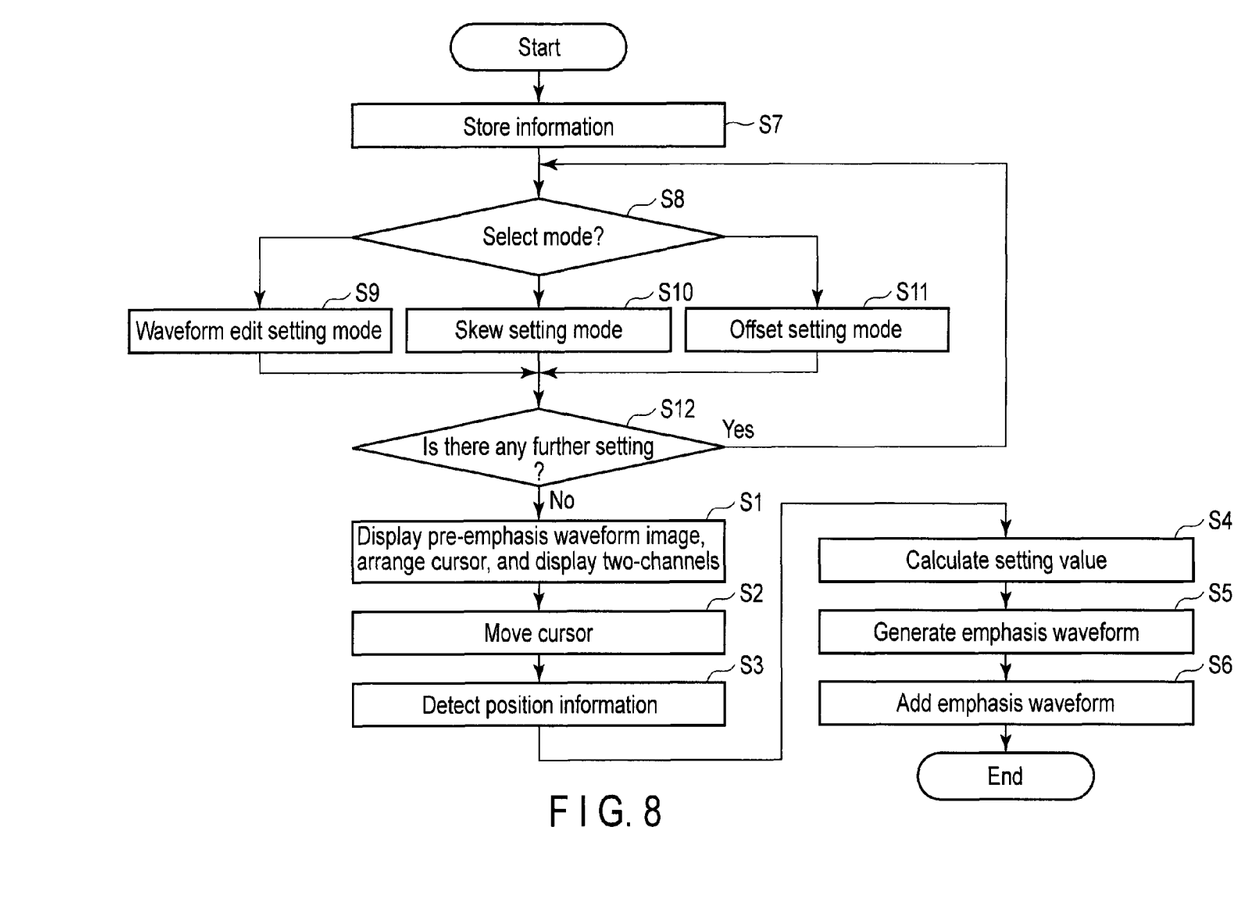
FIG. 8 is a flowchart illustrating operation of the emphasis-adding system as shown in FIG. 1.

In this case, operation of the emphasis-adding system according to this embodiment will be explained with reference to the flowchart of FIG. 8.

First, waveform information about a plurality of types of reference waveform patterns defined in advance, a changeable range of each cursor arranged in the reference waveform pattern, an amount of amplitude per dot of the display screen, and a time per dot on the display screen are stored to a memory (not shown) (S7).

Subsequently, any one of the waveform edit setting mode (S9), the skew setting mode (S10), and the offset setting mode (S11) are selected (S8).

Subsequently, when a determination is made as to whether there is any further setting or not, and when it is determined that there is further setting, the flow returns back to the mode selection in S8. When it is determined that there is no further setting, the flow proceeds to the subsequently described step (S12).

Subsequently, the pre-emphasis waveform image is displayed on the display screen with the horizontal axis representing a time and a vertical axis representing the amount of modulation, and in the pre-emphasis waveform image, a cursor is arranged at a portion where the intensity of the pre-emphasis can be changed (S1).

Subsequently, the cursor is moved (S2).

Subsequently, the position information of the moved cursor is detected (S3).

Subsequently, a setting value is calculated based on the detected position information about the cursor and the information stored in step S7 so as to generate an emphasis waveform corresponding to the pre-emphasis waveform image (S4).

Subsequently, the emphasis waveform corresponding to the pre-emphasis waveform image is generated based on the calculated setting values (S5).

Subsequently, the generated emphasis waveform is added to the test signal (S6).

In this case, a case where the skew setting mode (S10) is selected in step (S8) in which any one of the above modes is selected will be explained with reference to FIG. 8.

When the skew setting mode (S10) is selected, the pre-emphasis waveform image is displayed on the display screen with the horizontal axis representing a time and a vertical axis representing the amount of modulation, and a cursor is arranged at a portion where the intensity of the pre-emphasis can be changed in the pre-emphasis waveform image (S1). However, the pre-emphasis waveform images corresponding to test signals including two channels made from the same waveform is further displayed on the display screen.

Then, in the display screen, the pre-emphasis waveform images corresponding to the test signals including two channels are relatively moved in the time axis direction, so that the skew can be set.

In the setting screen of "skew setting mode" as shown in FIG. 3, the phase between the two pre-emphasis waveform images can be changed and the skew can be easily set by dragging a rising edge of one of the pre-emphasis waveform images using the mouse of the manipulating part 2 and moving and dropping the rising edge to a desired position within a movable range in the time axis direction.

Further, in the setting screen of "offset setting mode" as shown in FIG. 4, the offset can be easily set by dragging the offset line using the mouse of the manipulating part 2 and moving and dropping the offset line to a desired position within the movable range in the vertical direction.

Further, during the drag operation with the mouse of the manipulating part 2, the setting value calculating part 7 calculates the setting value in accordance with operation of the manipulating part 2, based on the position information provided by the position information detecting part 3 and various kinds of information provided by the information storing part 4, thus capable of automatically updating and displaying the setting value.

As described above, according to the embodiment of the this invention, the pre-emphasis waveform image is displayed on the display screen with the horizontal axis representing a time and a vertical axis representing the amount of modulation. The cursor corresponding to each emphasized bit of the waveform can be moved with operation of the manipulating part, whereby the amplitude can be changed in units of emphasized bits. Therefore, this can save the user from operation required for settings when the emphasis waveform is added to the original signal (test signal). Moreover, the user can not only recognize the generated emphasis waveform on setting screen, but also understand which portion of the emphasis waveform is manipulated on display screen, so that the user can intuitively set each parameter relating to the emphasis.

The pre-emphasis waveform images including two channels made from the same waveform are displayed on the display screen, and the phase between the two pre-emphasis waveform images can be changed and the skew can be easily set by dragging one of the pre-emphasis waveform images using the manipulating part and moving it to a desired position within the movable range in the time axis direction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An emphasis-adding system for giving pre-emphasis to a digital test signal that is input to a device-under-test, the emphasis-adding system comprising:
   a processor;
   a memory;
   a display part that displays a pre-emphasis waveform image on a display screen with a horizontal axis representing a time and a vertical axis representing an amount of modulation, a cursor being arranged at a portion where an intensity of the pre-emphasis is changeable in the pre-emphasis waveform image;

a manipulating part with which the cursor is moved;

an emphasis waveform addition part that generates an emphasis waveform corresponding to the pre-emphasis waveform image on the display screen, based on an amount of amplitude changed according to movement of the cursor, and adds the emphasis waveform to the test signal;

a position information detecting part that detects position information about the cursor moved with the manipulating part;

an information storing part that stores waveform information about a plurality of types of reference waveform patterns defined in advance, a changeable range of each cursor arranged at the tap of the reference waveform pattern, an amount of amplitude per dot on the display screen, and a time per dot on the display screen; and a setting value calculating part that calculates a setting value for generating an emphasis waveform corresponding to the pre-emphasis waveform image on the display screen, based on the information stored in the information storing part and the position information of the cursor detected by the position information detecting part, wherein the emphasis waveform addition part generates an emphasis waveform corresponding to the pre-emphasis waveform image on the display screen, based on the setting value calculated by the setting value calculating part, and adds the emphasis waveform to the test signal.

2. The emphasis-adding system according to claim 1, wherein the pre-emphasis waveform images corresponding to the test signals including two-channels made from the same waveform are displayed on the display screen of the display part, and a skew is set by relatively moving the pre-emphasis waveform images corresponding to the test signals including the two-channels in a time axis direction by manipulating the manipulating part.

3. An emphasis-adding method for giving pre-emphasis to a digital test signal that is input to a device-under-test, the emphasis-adding method comprising:

a pre-emphasis waveform image display step in which a pre-emphasis waveform image is displayed on a display screen with a horizontal axis representing a time and a vertical axis representing an amount of modulation, a cursor being arranged at a portion where an intensity of the pre-emphasis is changeable in the pre-emphasis waveform image;

a cursor moving step with which the cursor is moved;

an emphasis waveform generating step in which an emphasis waveform corresponding to the pre-emphasis waveform image is generated based on an amount of amplitude changed according to movement of the cursor;

an emphasis waveform adding step in which the generated emphasis waveform is added to the test signal;

an information storing step that stores waveform information about a plurality of types of reference waveform patterns defined in advance, a changeable range of each cursor arranged in the reference waveform pattern, the amount of amplitude per dot on the display screen, and a time per dot on the display screen;

a position information detection step in which position information of the moved cursor is detected; and a setting value calculating step in which a setting value for generating an emphasis waveform corresponding to the pre-emphasis waveform image is calculated based on the information stored in the information storing step and the position information of the cursor detected in position information detection step, wherein in the emphasis waveform generating step, an emphasis waveform corresponding to the pre-emphasis waveform image is generated based on the setting value calculated in the setting value calculating step.

4. The emphasis-adding method according to claim 3, wherein in the pre-emphasis waveform image display step, the pre-emphasis waveform images corresponding to the test signals including two-channels made from the same waveform are displayed on the display screen, and a skew setting mode is further provided in which a skew is set by relatively moving the pre-emphasis waveform images corresponding to the test signals including the two-channels in a time axis direction.

5. An emphasis-adding system for giving pre-emphasis to a digital test signal that is input to a device-under-test, the emphasis-adding system comprising:

a processor;

a memory;

a display part that displays a pre-emphasis waveform image on a display screen with a horizontal axis representing a time and a vertical axis representing an amount of modulation, a cursor being arranged at a portion where an intensity of the pre-emphasis is changeable in the pre-emphasis waveform image;

a manipulating part with which the cursor is moved;

an emphasis waveform addition part that generates an emphasis waveform corresponding to the pre-emphasis waveform image on the display screen, based on an amount of amplitude changed according to movement of the cursor, and adds the emphasis waveform to the test signal, wherein the pre-emphasis waveform images corresponding to the test signals including two-channels made from the same waveform are displayed on the display screen of the display part, and a skew is set by relatively moving the pre-emphasis waveform images corresponding to the test signals including the two-channels in a time axis direction by manipulating the manipulating part.

6. An emphasis-adding system for giving pre-emphasis to a digital test signal that is input to a device-under-test, the emphasis-adding system comprising:

a processor;

a memory;

a display part that displays a pre-emphasis waveform image on a display screen with a horizontal axis representing a time and a vertical axis representing an amount of modulation, a cursor being arranged at a portion where an intensity of the pre-emphasis is changeable in the pre-emphasis waveform image;

a manipulating part with which the cursor is moved; and an emphasis waveform addition part that generates an emphasis waveform corresponding to the pre-emphasis waveform image on the display screen, based on an amount of amplitude changed according to movement of the cursor, and adds the emphasis waveform to the test signal, wherein the pre-emphasis waveform image corresponding to the test signal and an offset line parallel to the horizontal axis are displayed on the display screen of the display part, and an offset value is set by moving the offset line in a vertical axis direction by manipulating the manipulating part.

7. An emphasis-adding method for giving pre-emphasis to a digital test signal that is input to a device-under-test, the emphasis-adding method comprising:
- a pre-emphasis waveform image display step in which a pre-emphasis waveform image is displayed on a display screen with a horizontal axis representing a time and a vertical axis representing an amount of modulation, a cursor being arranged at a portion where an intensity of the pre-emphasis is changeable in the pre-emphasis waveform image;
- a cursor moving step with which the cursor is moved;
- an emphasis waveform generating step in which an emphasis waveform corresponding to the pre-emphasis waveform image is generated based on an amount of amplitude changed according to movement of the cursor;
- an emphasis waveform adding step in which the generated emphasis waveform is added to the test signal,
- wherein in the pre-emphasis waveform image display step, the pre-emphasis waveform images corresponding to the test signals including two-channels made from the same waveform are displayed on the display screen, and
- a skew setting mode is further provided in which a skew is set by relatively moving the pre-emphasis waveform images corresponding to the test signals including the two-channels in a time axis direction.

8. An emphasis-adding method for giving pre-emphasis to a digital test signal that is input to a device-under-test, the emphasis-adding method comprising:
- a pre-emphasis waveform image display step in which a pre-emphasis waveform image is displayed on a display screen with a horizontal axis representing a time and a vertical axis representing an amount of modulation, a cursor being arranged at a portion where an intensity of the pre-emphasis is changeable in the pre-emphasis waveform image;
- a cursor moving step with which the cursor is moved;
- an emphasis waveform generating step in which an emphasis waveform corresponding to the pre-emphasis waveform image is generated based on an amount of amplitude changed according to movement of the cursor;
- an emphasis waveform adding step in which the generated emphasis waveform is added to the test signal; and
- an offset setting step of displaying the pre-emphasis waveform image corresponding to the test signal and an offset line parallel to the horizontal axis on the display screen, and setting an offset value by moving the offset line in a vertical axis direction.

* * * * *